United States Patent [19]

Winchell et al.

[11] Patent Number: 4,965,741

[45] Date of Patent: Oct. 23, 1990

[54] METHOD FOR PROVIDING AN IMPROVED HUMAN USER INTERFACE TO A KNOWLEDGE BASED SYSTEM

[75] Inventors: Michael A. Winchell; Robin L. Steele, both of Fort Collins, Colo. 80526

[73] Assignee: NCR Corporation, Dayton, Ohio

[21] Appl. No.: 258,961

[22] Filed: Oct. 17, 1988

[51] Int. Cl.⁵ .................... G06F 15/00; G06F 15/20; G09C 15/00

[52] U.S. Cl. .................... 364/513; 364/488; 364/521; 364/490; 364/491

[58] Field of Search ................. 364/474, 24, 513, 488, 364/521, 490, 491, 489, 200 MS File, 900 MS File, 513

[56] References Cited

U.S. PATENT DOCUMENTS

| | | | |
|---|---|---|---|
| 4,651,284 | 3/1987 | Watanabe et al. | 364/513 |
| 4,700,317 | 10/1989 | Watanabe | 364/488 |
| 4,803,641 | 2/1989 | Hardy et al. | 364/513 |
| 4,813,013 | 3/1989 | Dunn | 364/900 |
| 4,816,994 | 3/1989 | Freiling et al. | 364/513 |
| 4,847,784 | 7/1989 | Clancey | 364/513 |

Primary Examiner—Jerry Smith
Assistant Examiner—Jim Trammell
Attorney, Agent, or Firm—Wilbert Hawk, Jr.; Casimer K. Salys; James M. Stover

[57] ABSTRACT

An improved method for interfacing a human user to the combination of an expert system and a computer aided design system, characterized in that the expert system advice is provided in various formats, the expert system provides for interrupted operation with usable intermediate advice, and expert system advice is transportable in relative correspondence into the computer aided design system schematic display environment.

3 Claims, 12 Drawing Sheets

FIG. 10

| ncr_design_advisor_tm | |
|---|---|
| CONFIGURATION | User Input prompted at 14:45:44, 9-21-1988<br>Please enter ues or no ( y - n ) |
| INITIALIZE | |
| LOAD NETLIST | no |
| SAVE CURRENT STATE | User Input accepted at 14:45:48, 9-21-1988 |
| ROLLBACK TO LAST SAVE | ••••UNRESOLVED•••• |
| MISC. FUNCTIONS > | |
| QUIT | |
| CONSULTATION | Advice - 5 ( IMBEDDED - CLK - ELEM ) remains IN since the contradiction was not resolved. You may 'Oppose' this advice to change its status.<br>14:45:50, 9-21-1988<br>Please indicate the reason for attempting to contradict ADVICE - 5. |
| SELECT EXPERTISE > | |
| CONTRADICT ADVICE: | • User – supplied Comment<br>  Although the imbedded element I - 1464 cannot be reset directly by loading a 0 |
| OPPOSE ADVISE: | or a 1, it can be reset in one of two ways. The most used method will be via the reset sequence which requires certain states to be reset before others. |
| INFORMATION | The other way that I - 464 can be reset is indirectly through the 'GMAT' data path which is only imbedded in one level. --jim |
| LIST ADVICE > | |
| LIST FILES LOADED | |
| COMMAND HISTORY | |
| NETED | > Neted<br>Please enter the pathname of the directory that holds the MENTOR NETED files for your design or just < return > to accept the default. |
| CONTEXT/HELP > | The default Design is / user / asci / software / da / da_files / designs / demo_neted_files |
| | Design Entered: / user / asci / software / da / da_files / designs / demo_neted_files |
| | When resolving the pathname entered, the directory<br>/ / fritz / local_user / desad / release1.3 / da_files / designs / demo_neted_files was found. Is this the directory that holds the MENTOR NETED files for this design? |
| | Yes |
| | Extracting information from the NETED design files . . . 14:50:52, 9 - 21 - 1988 |
| Main Menu> ▲neted | Involking Neted in a new process for design |
| Enter a command from the top menus<br>left mouse button - > select menu item | # P" / / fritz / local_user / desad / release1.3 / da_files / designs / demo_neted_files .<br>. 14:52:43, 9 - 21 - 1988<br>Invocation of NETED completed. |

METHOD FOR PROVIDING AN IMPROVED HUMAN USER INTERFACE TO A KNOWLEDGE BASED SYSTEM

Background of the Invention

The present invention relates to the use of expert systems, in conjunction with computer aided design systems, for the purpose of designing integrated circuit devices. More particularly, the invention relates to refinements in such combined use of expert and computer aided design systems which ensure an efficient and effective interface with human operators.

Expert systems have become accepted as tools suitable for assisting circuit designers in the development of integrated circuit devices. In such applications of expert systems, the knowledge resident in the expert system either supplements or supplants the integrated circuit design capabilities of the human undertaking the actual schematic level configuration of the integrated circuit device. A representative tool of such class expert system is describe in PCT International Application No. PCT/US85/01063 published Dec. 19, 1985, which was identified as corresponding to U.S. Patent application Ser. No. 06/617,791 filed June 6, 1984. A relatively detailed development of such expert systems, as elements of a larger technology known as artificial intelligence, is set forth in the textbook entitle "Understanding Artificial Intelligence", developed and distributed by Texas Instruments Information Publishing Center, and having a 1985 copyright date. The latter text identifies and describes a number of expert systems, including MYCIN, BUGGY, DENDRAL, Dipmeter Advisor TM, Internist, ISIS, MACSYMA, MOLGEN, Prospector, TEIRESIAS, and Explorer.

Diverse video display screen representations, including hierarchically arranged and overlapping windows, are noted as representative features available on such expert systems. Typical LISP language based expert systems incorporate help facilities which provide the human user with a limited degree of flexibility in interfacing to the computer upon which the expert system operates. Typical help facilities for video display interfaces include status lines, help keys, definition or glossary files, online documentation facilities, and notification windows for special messages.

The interfaces between human operators and computer aided design systems per se have been the subject of numerous development efforts. Representative approaches are disclosed in U.S. Pat. Nos. 4,451,895; 4,613,946 and 4,635,208. In such references, the interaction between a human and a computer with hierarchical control of the video display representations are considered in a context lacking expert systems capabilities. The use of a human interface in conjunction with an expert system is described as then in existence in the paper authored by Steele, entitled "An Expert System Application in Semicustom VLSI Design" and published as paper 35.4 in the Proceedings of the 24th IEEE/ACM Design Automation Conference of June 28–July 1, 1987.

The relatively recent and rapid advances in the use of computer aided design systems to develop integrated circuit products, and the coincident increase in the complexity of the functions and semiconductor design consideration of such products, have led to a overwhelming need for the integration of expert system capabilities with computer aided design system tools. In response to such needs, the joint venture known as Microelectronics and Computer Technology Corporation (MCC) developed the inference engine Proteus for representing integrated circuit technology in a knowledge base. This inference engine and a proprietary knowledge base were combined with a commercial computer aided design tool using LISP language code to provide human users with access to the capabilities of the inference engine and the knowledge base in the course of developing integrated circuit products. Other knowledge based systems of this class include R-1, MRS, DUCK/ARBY, EMYCIN, PLANNER and related works at Rutgers University and Stanford University.

The problem with Proteus and other less sophisticated inference engines resides in the difficulty of interfacing to a human user who is not conversant in LISP or other conventional expert system software language. This difficulty is compounded by the complexity of the integrated circuit designs which the human users are now routinely implementing in semiconductor products. The human users are often specialists in a very narrow class of technology. Consequently, even with the availability of an integrated circuit design knowledge base and a powerful inference engine, experience has shown that integrated circuit designers are routinely incapable of conversing with the inference engine whether directly through LISP or indirectly through available higher level shell languages.

In the context of such interface difficulties, experience has also shown that the advice rendered by the expert systems, based upon a circuit schematic information entered by the human user, is often in a format which is not readily comprehensible by the human user. Too often the expert system advice is cryptic from the perspective of the circuit design. Another somewhat more mundane problem frequently encountered in the use of expert systems to evaluate integrated circuit designs is attributable to the relatively long run time exhibited by the expert system inference engines in the course of exhaustively applying relatively elaborate knowledge bases to circuit schematics. In such contexts, it is often valuable to consider incremental expert system advice and to incorporate interim refinements attributable to such advice. A third and prevailing problem common of expert systems is the inability to use and interact with the computer aided design system schematic while considering the advice issued by the expert system. Integration of the two systems would be particularly valuable in the context of a video display where the subject of the advice is schematically represented on the screen concurrent with the substance of the advice. Such a facility would allow a technically skilled human user to directly identify and consider the subject of the advice together with the nature of the deficiency identified by the expert system. It is these objectives that the present improvements satisfy in the course of articulating a procedure of suitable form and content.

SUMMARY OF THE INVENTION

In the context of the problems and objectives set forth hereinbefore, the invention provides improved processes for interfacing a human user to an expert system operating in conjunction with computer aided design tools in the course of designing a complex integrated circuit product. The processes of the invention have three facets. First, the invention is directed toward providing expert system advice in formats consistent with the level of detail desired by the human user. As a second facet, the invention defines an improved procedure by which expert system advice can be extracted incrementally. Lastly, the invention defines a process by which expert system advice and integrated circuit system schematic information can be portrayed concurrently and in a format consistent with the human user's capabilities to use the information.

The procedures defined by the invention are preferably implemented by computer code as prescribed by flow diagram to interface the inference engine to the video display screen perceivable by the human user. The procedure includes control code sequences which interact with the computer aided design system tool in one aspect, and with a menu building code of the video display interface as a second aspect. Advice formatting proceeds along three routes depending on whether summary information, brief text, or full text explanation of the advice is desired. The present invention also defines a procedure for extracting interim advice. Such extraction follows a sequence which provides the human user with interim information corresponding to the advice derived as of the time the expert system is interrupted. As a last facet, the invention provides a procedure for merging and concurrently displaying computer aided design system schematic information with expert system advice through links between the advice files and the schematic capture files.

These and other features of the invention will be more clearly understood and appreciated upon considering the detailed description which follows.

BRIEF DESCRIPTION OF THE DRAWINGS

FIGS. 7-12 schematically illustrate selected screen representations from an integrated circuit design system which combines expert system and computer aided design system tools.

DESCRIPTION OF THE PREFERRED EMBODIMENT

Figure 1:
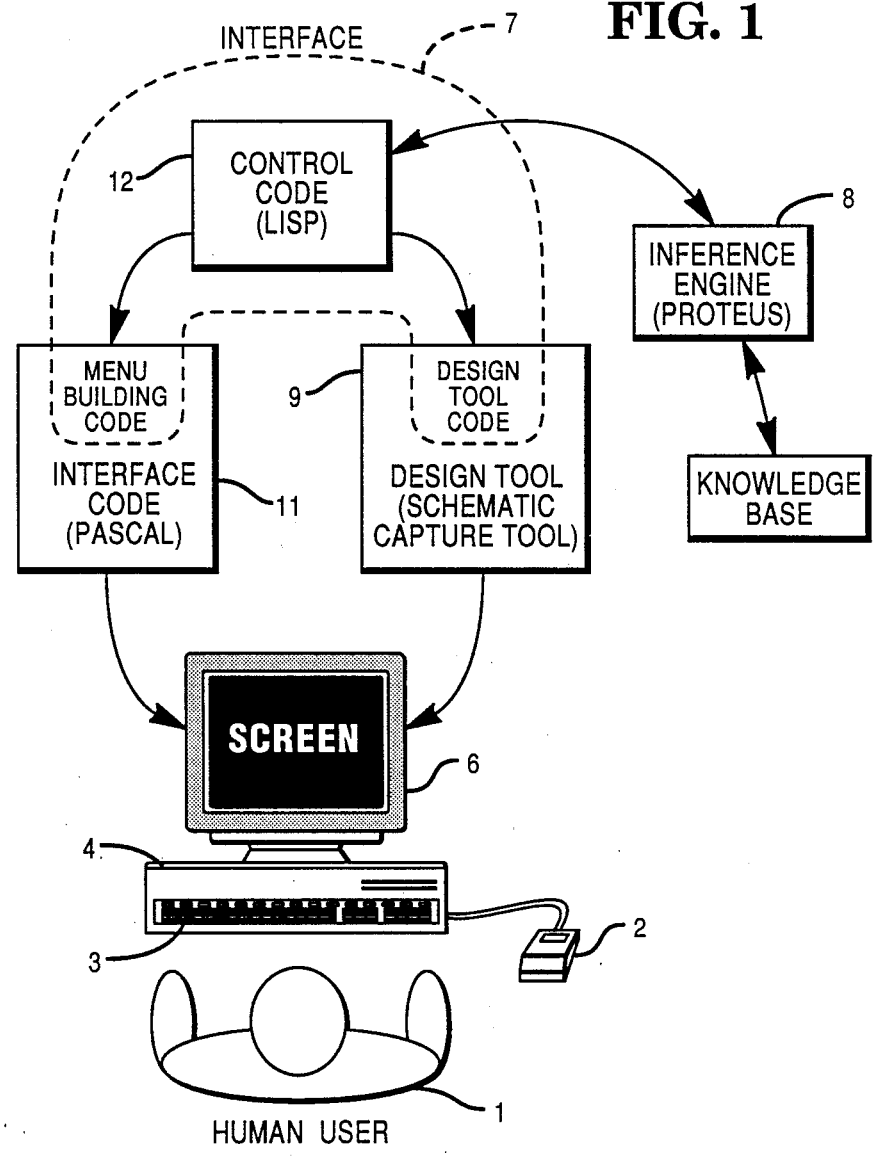
FIG. 1 is a schematic representing the general relationships between the human user, the computer aided design system, the expert system and the interface by which the entities are linked.

The improved procedures to which the present invention pertains provide an integrated circuit designer with a working environment in which the advice format is selectively detailed, in which the designer may seek advice at interim stages of the analysis, and in which the designer can concurrently access both expert advice and schematic information. This is accomplished in the context of the overall computer aided design system development setting depicted in FIG. 1. As shown in the figure, human user 1 interacts through mouse 2 and/or keyboard 3 with computer 4 to obtain on screen 6 the combined expert system and circuit schematic based information.

Conventional use of advanced expert systems require the human user 1 generate LISP or expert system shell language control code to communicate with the expert system inference engine. The development of the advanced inference engine Proteus by MCC further burdened the user in that knowledge of both LISP and Proteus became necessary to effectively use the expert system. Consequently, there developed the need for a shell operating procedure suitable for a human user to interface with the expert system, and the computer aided design system tool, without a prerequisite working knowledge of LISP or Proteus.

Prior uses of expert systems to help humans design integrated circuit products required that the human users interact with the expert system independent of their work on the computer aided design tool. Furthermore, the advice furnished by the expert system was not only fixed in scope but relatively cryptic as to particularized explanation. As a third element of such prior expert systems, interruption of the expert system resulted in a loss of all advice information. Consequently, the user was often placed in a position of either allowing the computer to operate for an inordinate amount of time before concluding that an error had prevented appropriate operation, or ceased the analysis prematurely but with the recognition that the complete run will have to be repeated following error analysis. The structure of LISP code does provide a user with some degree of ability to track the progress of the expert system computer operation.

The present invention provides an interface 7 which has three procedural features of particular interest and value for the environments described above. First, the advice is provided in a format which is variable according to the desires of the human user. Second, the operational sequence provides for an interrupt of the expert system analysis, suitable to return to the previous state as well as to view the results preceding the interrupt. And lastly, the present interface defines a procedure for integrating the expert system and computer aided design system to facilitate human user interplay between related information in each system. In the context of the representations in FIG. 1, there is now defined an interface 7 which serves as a shell and link between the video display user communications medium 6, the Proteus based inference engine 8, the commercially available design tool 9 and the basic menu and interface code 11, to provide the human user 1 with the three unique and beneficial capabilities.

In view of the extensive commercial availability and routine use of diverse design tool code, interface code, and LISP based code suitable to control expert system inference engines, particularization of such code is neither practiced nor useful. This is particularly true since the interface procedure to which the invention pertains is generic as to the application environments when such environments include the elements of an expert system, having an inference engine and a knowledge base, a computer aided design tool system, and some means for communicating with a human user.

Interface 7 of the knowledge base system depicted in FIG. 1 is comprised of the control code 12, based upon LISP language, which interacts with the inference engine 8, operated in Proteus language, and further extends to include the menu building code of interface code character, using PASCAL language, and design tool code, integrated with a schematic capture tool program of the computer aided design tool 9.

Figure 6:
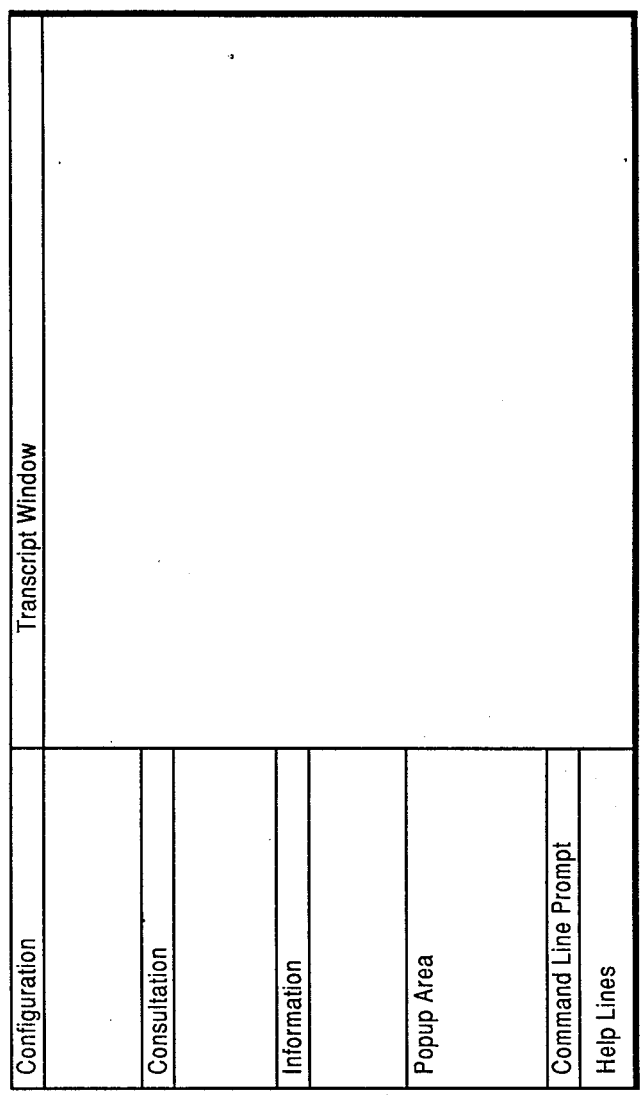
FIG. 6 is a schematic illustrating a preferred video screen arrangement for practicing the process of the invention.
Figure 7:
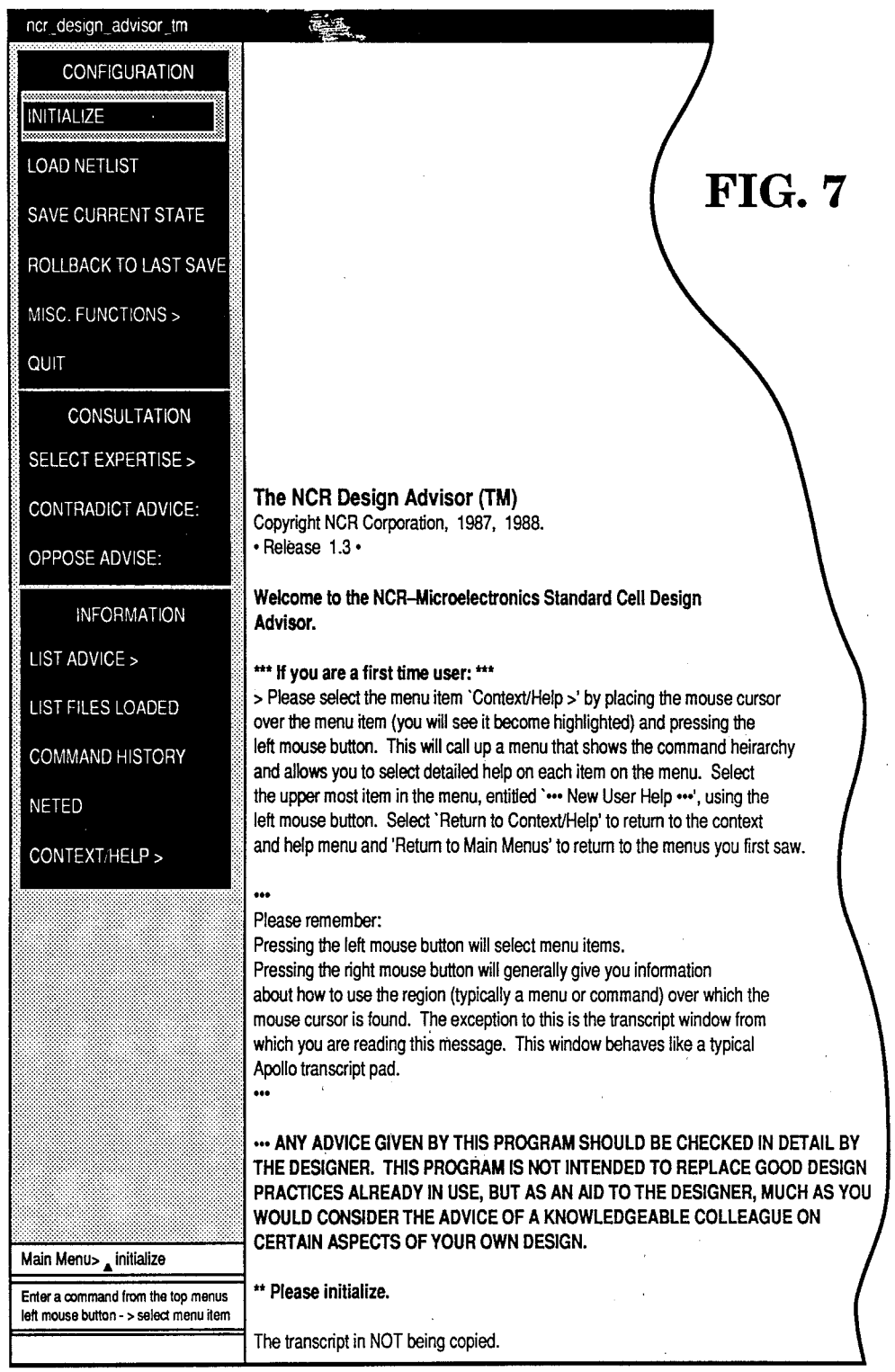

FIG. 6 illustrates a preferred arrangement of the information displayed on screen 6 (FIG. 1) during the interaction with the expert system. FIG. 7 provides a representative screen during the start of the interaction between the human user and the expert system.

Figure 2:
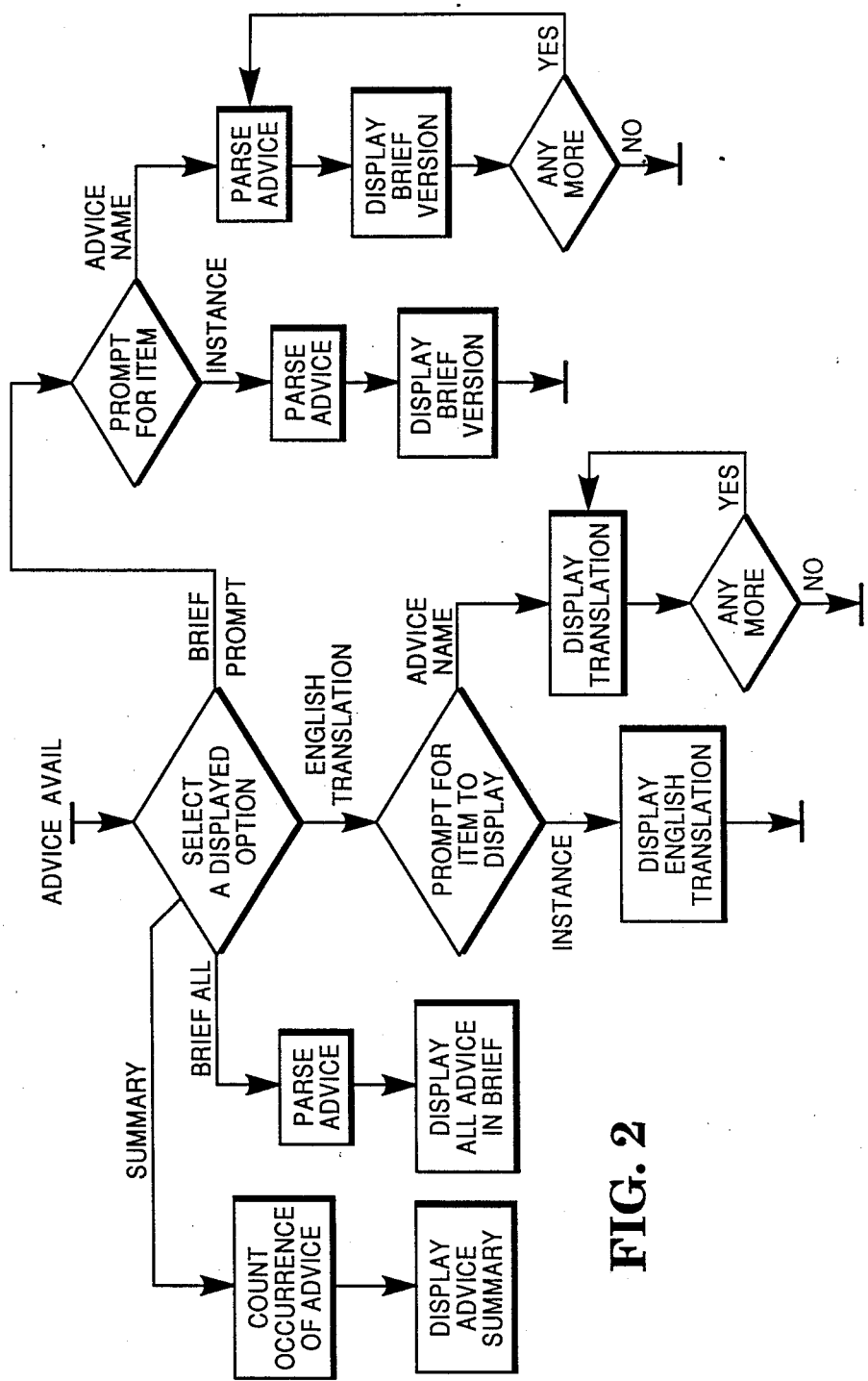
FIG. 2 is a flow diagram schematically illustrating a procedure for providing advice in different formats.

The first aspect of the invention relates to the advice format process by which expert system information is conveyed to the human user, now available in a form consistent with the ability of the human user to understand and utilize the information. The flow diagram of the advice format procedure is depicted in FIG. 2 of the drawings. The entry point for the procedure coincides with an indication by the expert system that the advice is available. Thereafter, as shown, the human user selects one of four options, namely, the "advice summary" format, the "brief all" format, the "brief prompt" format, or the full text "english translation". If the summary format is selected, the expert system advice is presented on screen 6 (FIG. 1) in highly abbreviated form. On the other hand, if the brief all option is selected, not only is the advice presented in a somewhat more extensive format, but the advice encompasses all advice derived during the analysis performed by the expert system. If the brief prompt format is selected, the human thereafter chooses either a category of advice or a particular instance of advice to be displayed in the brief format. As a fourth option available, the human user is provided with an opportunity to obtain a full english text description of the advice item and may either obtain a display of the corresponding instance or identify another advice item by name to produce a corresponding display and further selection availability.

Figure 8:
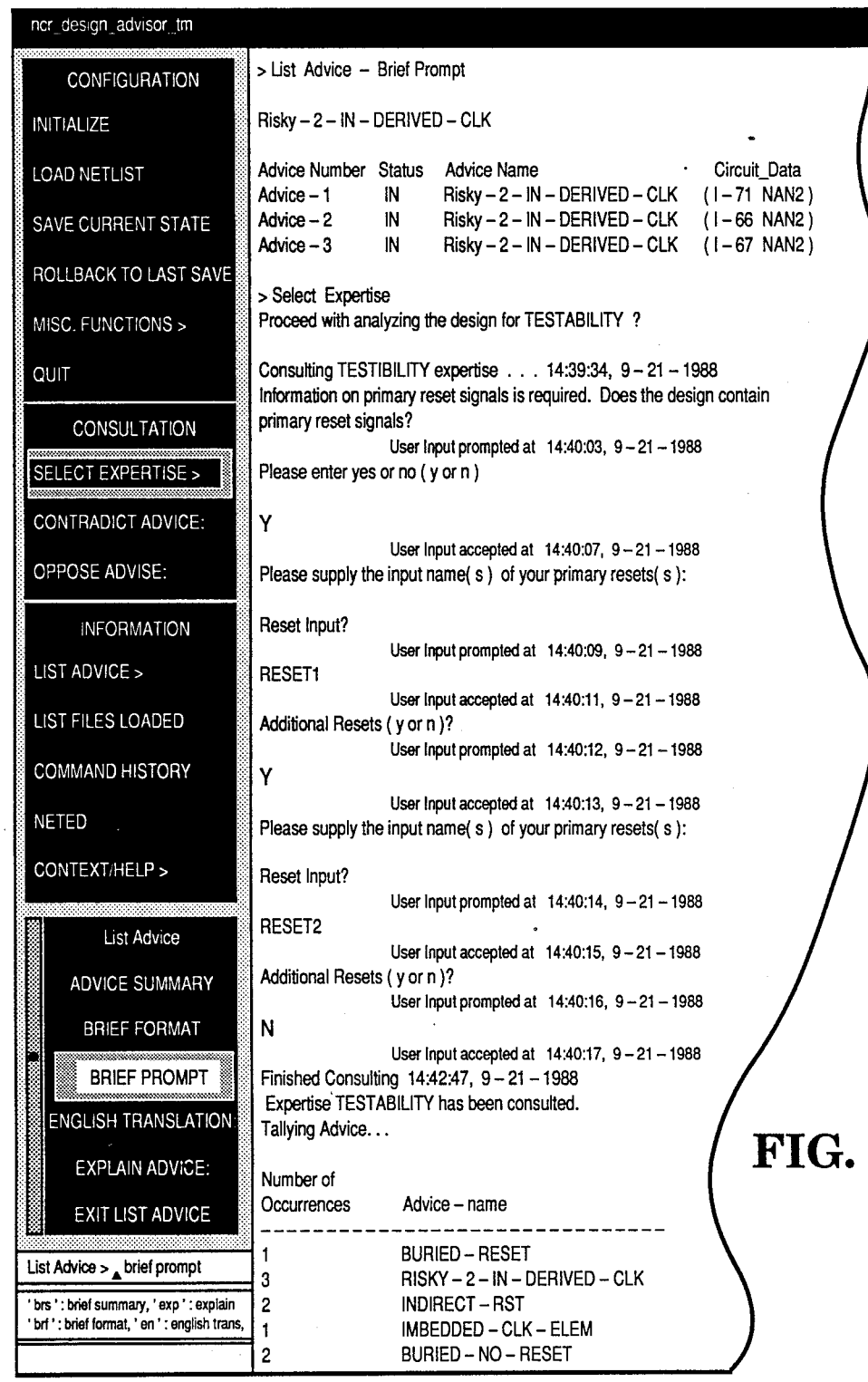
Figure 9:
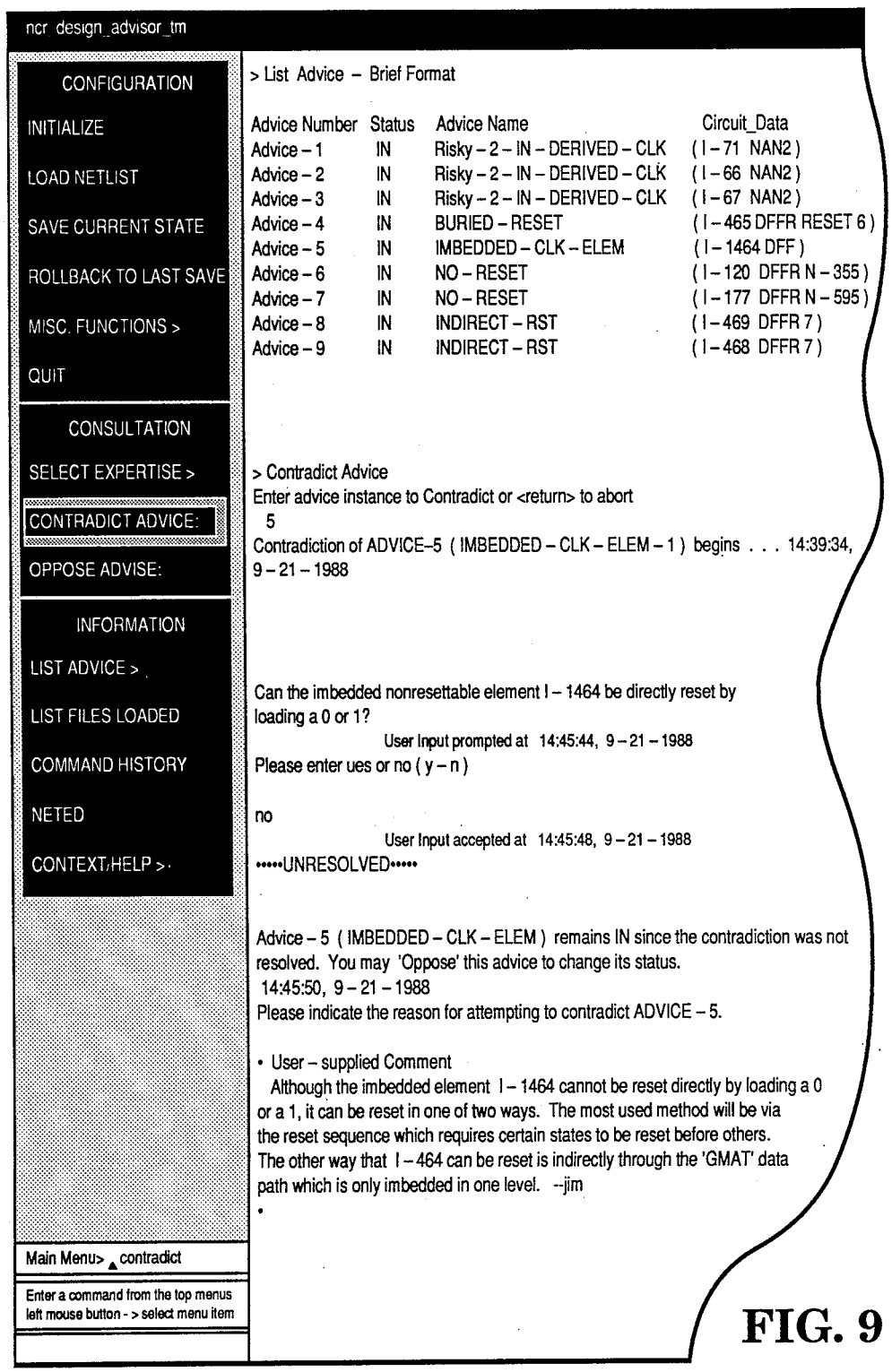

Representative embodiments of advice items presented in summary format and brief prompt format are shown as they would appear on a segment of a video display screen in FIG. 8 of the drawings. The advice in summary format is shown at the bottom-right, where the advice names and number of occurrences are identified in summary format. For example, the expert system has concluded that there exist three occurrences of a risky situation in which a clock signal is derived rather than being directly driven from the master. At the top of the display there is shown a response using the brief prompt format to present the advice corresponding to the previously noted problem as identified by the expert system. In this case, the three occurrences are in brief format individually identified in terms of defect character and circuit location. For example, as to the second element of advice, the previously noted risky situation is identified as affecting the two input NAND block numbered I-66. The brief all option results, as shown in FIG. 9, have all the advice concurrently represented in brief format. In contrast, the english translation option would have provided the human user with exhaustive circuit deficiency information in a terminology suitable for understanding by a circuit designer of nominal training and experience.

The advice format procedures depicted by flow diagram in FIG. 2 and illustrated by example in FIG. 8, provide the expert system user with the flexibility of obtaining and utilizing information in a format having detail consistent with his or her ability to absorb and use the expert advice in refining the circuit design. In this way, an inexperienced user of the expert system is not subjected to a LISP code environment with cryptic analysis information, while at the same time an experienced user is not encumbered by lengthy text intended for a neophyte.

FIG. 9 illustrates the use of the brief all format option for the analysis first shown in FIG. 8, and includes a representative course of dialogue between the human user and the expert system based upon the advice. The example presented in FIG. 9 involves a contradiction of ADVICE 5, where the human user upon understanding the advice given by the expert system disagrees with the conclusion because of a technical refinement in his circuit and enters into the record comments suitable to explain his contradiction of the advice.

As a second and desirable feature of the interface 7 in FIG. 1, the present procedure contemplates the inclusion of an interrupt within inference engine 8 suitable to cease further analysis, and, preferably, then store the existing advice and status data to disk or other file. In the case of example inference engine 8, a DISKSAVE command in LISP following a SAVESESSION command from the menu initiates a Proteus subroutine to save the current state of the advice and the break point in the analysis. Furthermore, the procedure extracts for consideration the advice generated prior to the interrupt. The interrupt and restart process as contemplated by the present invention facilitates shared use of the expert system together with the earlier noted benefit of accessing interim advice information from the expert system to identify pervasive deficiencies early in the analysis.

Figure 3:
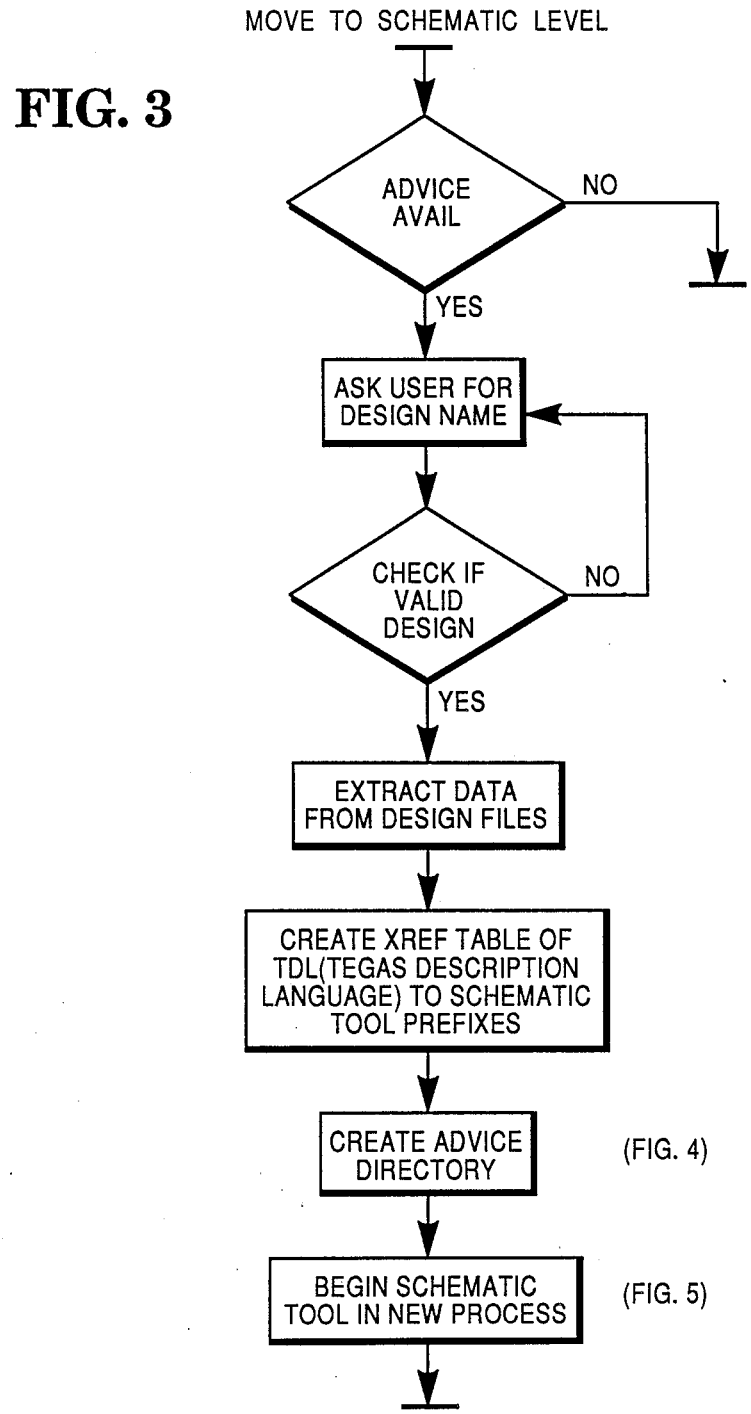
FIG. 3 is flow diagram schematically representing a method for coupling the expert system with the integrated circuit schematic representation system.

The third process of the present invention, distinctly suited for use in a knowledge based integrated circuit design system including an expert system and a computer aided design tool system, involves the integration of the advice information with the circuit elements pertaining to such advice while in a circuit schematic environment. The process begins, as shown in FIG. 3, with a decision to move into the schematic level as generated and controlled by the computer aided design system. First, the availability of expert system advice is verified, irrespective of whether such advice is derived from an interrupted or completed analysis. The existence of the related schematic is then verified. Next, data from the design files is extracted for a successive creation of cross-reference tables relating the advice and schematic information. The last two steps of the procedure, creating an advice directory and commencing work at the schematic level, are individually expanded by step in respective FIGS. 4 and 5.

Figure 4:
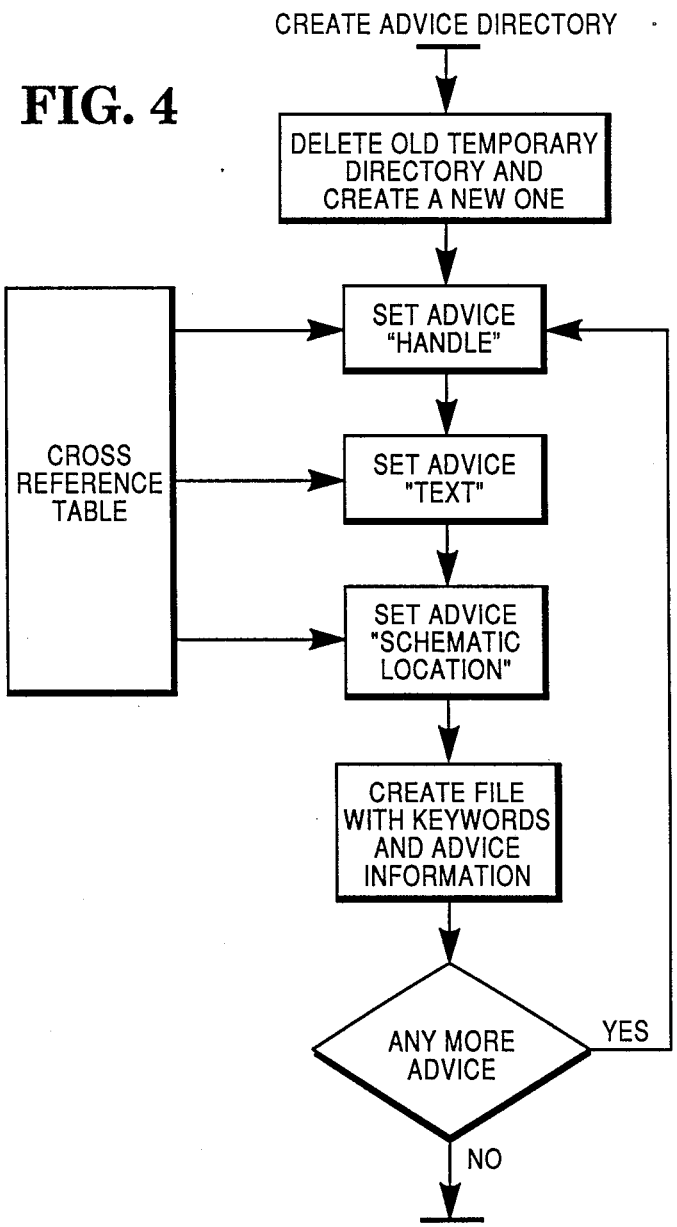
FIGS. 4 and 5 are flow diagram expansions of blocks within FIG. 3.

The procedure for creating an advice directory is shown in FIG. 4 to begin with the deletion of the previous directory and successive establishment of a newly identified directory. The new directory relates device identification or handle information, advice text, and schematic location information to the previously developed cross-reference table in a file of key words and advice information. The directory creation procedure is repeated for each item of advice until all are exhausted. Thereafter, schematic tool use in the computer aided design system environment commences, as shown in the sequences of FIGS. 3 and 5, with the generation of a schematic having advice cross-references.

Figure 5:
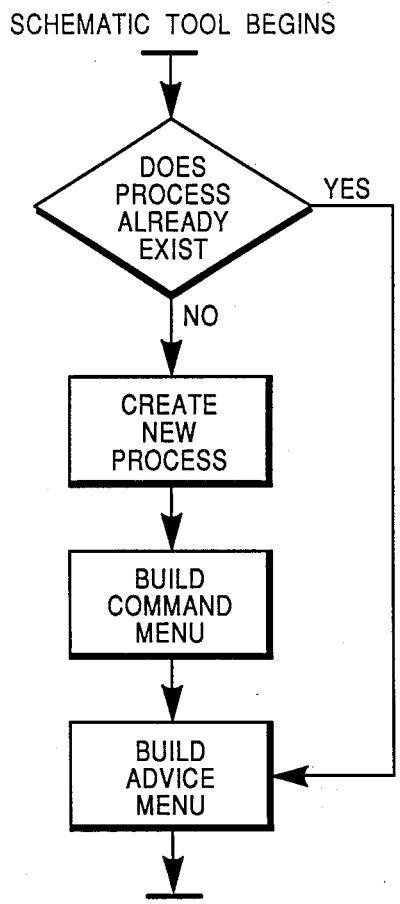

FIG. 5 shows that if the schematic to which the inquiry is to be directed already exists in file, only the advice menu needs to be created for screen display. Otherwise, the schematic representing the circuit segment subject to the expert system advice is generated and conveyed in conjunction with the command menu and a constructed advice menu to the video display.

Figure 11:
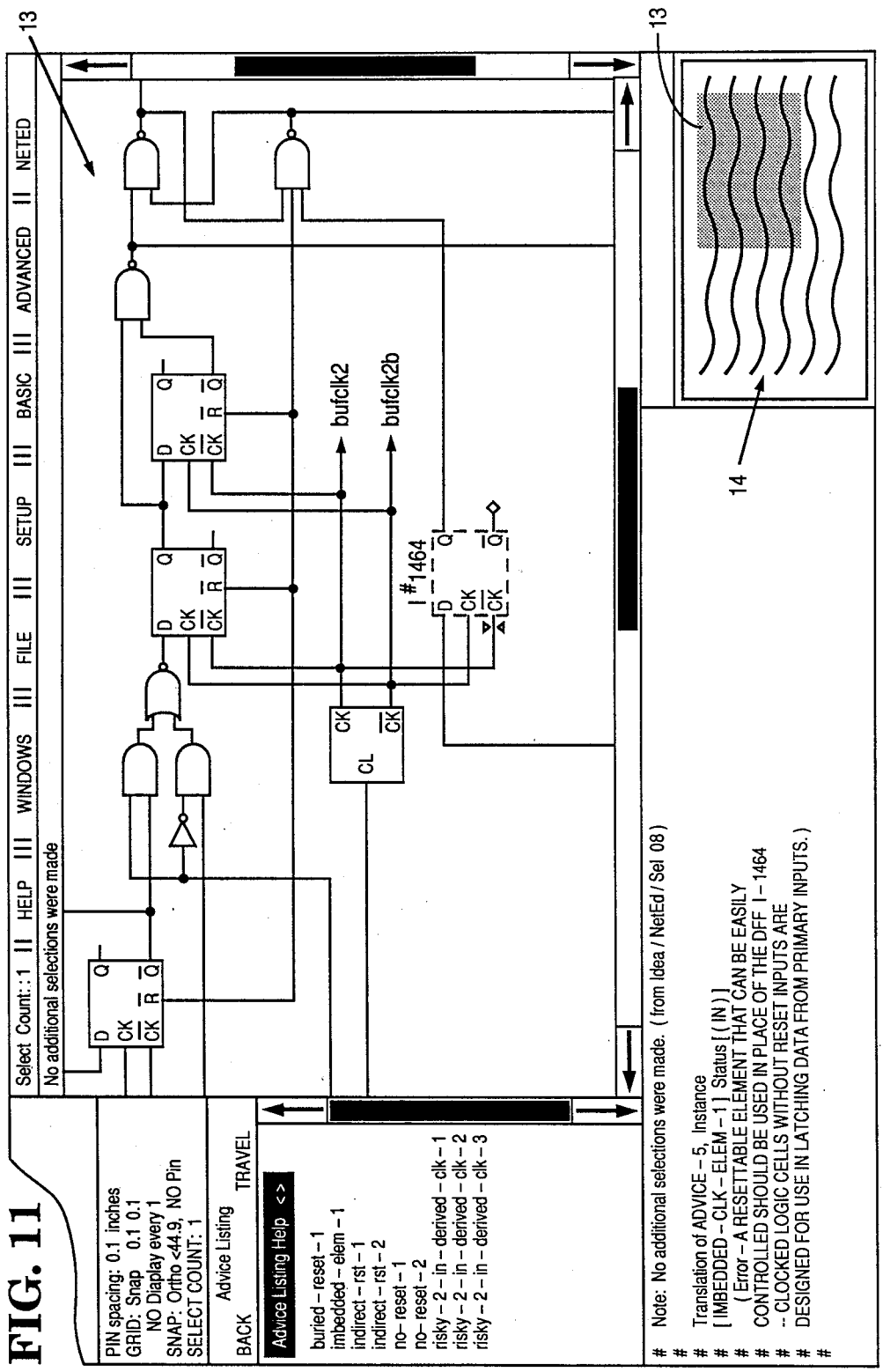
Figure 12:
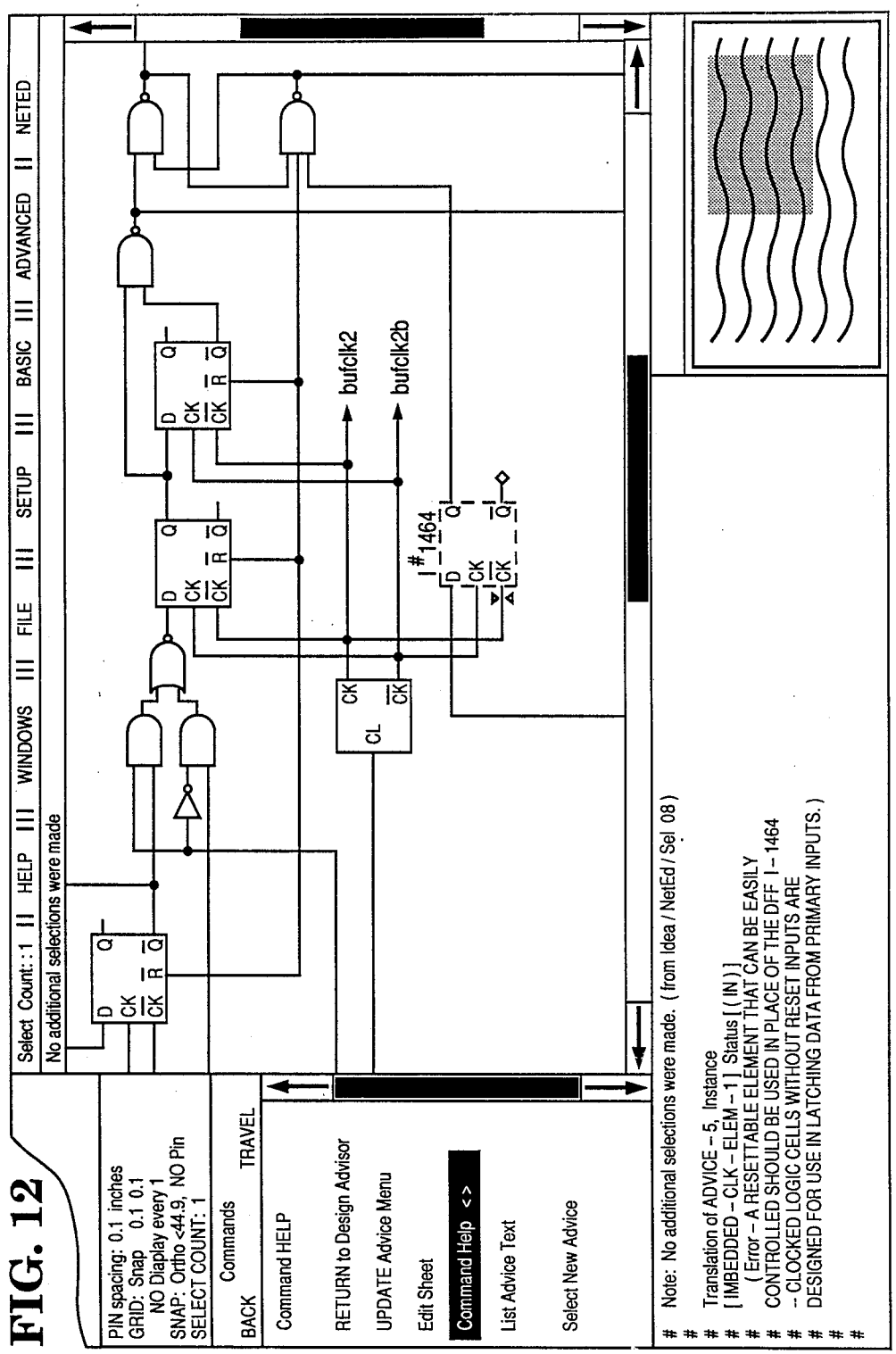

Exemplary screens from the progression of operations depicted in FIG. 3, are shown in FIGS. 10, 11 and 12, FIG. 10 illustrates the expert system screen immediately before entry into the schematic capture tool environment, the entry being accomplished through the selection of the NETED function. FIG. 11 illustrates a representative screen while in the computer aided design system environment which corresponds to the advice derived from the expert system. For example, the schematic of instance 13 is related to ADVICE 5 involving block I-1464. Concurrently, instance 13 itself is shown in relation to a larger schematic region 14 of the complete integrated circuit design. ADVICE 5 is now fully developed to inform the circuit designer that the latch I-1464 is not resettable as originally designed, and as such is likely to cause function failures in the overall circuit. While in the environment of the computer aided design tool, the human user is able to consider the functional elements to which the advice pertains in both a micro and macro circuit level environment, to modifying the design in response to a deficiencies identified by the advice, and to do so in the concurrent presence of the full advice information. Note in FIG. 12 that one of the command window options (identified as "Return To Design Advisor") provides a direct path back into the expert system environment.

In the composite, the various processes defined herein provide the human user with the flexibility of extracting expert advice at a level of abstraction consistent with his or her skills, allows the interruption and use of then available advice, and facilitates the concurrent use of expert system and computer aided design schematic information.

It will be understood by those skilled in the art that the embodiments forth hereinbefore are merely exemplary of the numerous arrangements by which the invention may be practiced, and as such may be replaced by equivalents without departing from the invention which will now be defined by appended claims.

We claim:

1. An improved process for interfacing a human with knowledge based integrated circuit design system, in which a computer aided design system is capable of executing schematic capture and an expert system is capable of analyzing the schematic to identify design deficiencies, wherein the improvement comprises:
   electronically extracting advice information from the expert system;
   electronically inserting into an advice directory a cross-reference to said extracted advice, the extracted advice text, and the extracted advice schematic location information;
   storing the advice directory in a file by advice key words;
   building an advice menu suitable to select extracted advice information by said key words;
   building a command menu suitable to manipulate computer aided design system schematic information; and
   displaying in response to selection by the human user both schematic information and advice information in correspondence with the location of the schematic information.

2. The process recited in claim 1, including the additional prior steps of:
   detecting an interrupt request issued by the human during an ongoing analysis of the schematic by the expert system;
   storing the state of the analysis upon interrupt;
   detecting a request by the human for access to the analysis advice then available; and
   displaying the advice in a format selected by the human.

3. The process recited in claim 2, including the further steps of:
   accepting text annotations into the design system upon entry by the human; and
   storing the text annotations in the design system referenced to the related advice.

* * * * *